United States Patent
Miller et al.

(10) Patent No.: US 9,767,062 B2
(45) Date of Patent: Sep. 19, 2017

(54) LOW POWER PARALLELIZATION TO MULTIPLE OUTPUT BUS WIDTHS

(71) Applicant: Avago Technologies General IP (Singapore) Pte. Ltd., Singapore (SG)

(72) Inventors: Darrin C. Miller, Fort Collins, CO (US); Peter J. Meier, Fort Collins, CO (US); Gilbert Yoh, Fort Collins, CO (US)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 228 days.

(21) Appl. No.: 14/689,677

(22) Filed: Apr. 17, 2015

(65) Prior Publication Data
US 2016/0306765 A1     Oct. 20, 2016

(51) Int. Cl.
| | | |
|---|---|---|
| *G06F 13/40* | (2006.01) | |
| *G06F 13/42* | (2006.01) | |
| *G06F 1/08* | (2006.01) | |
| *G06F 3/06* | (2006.01) | |
| *G06F 13/38* | (2006.01) | |

(52) U.S. Cl.
CPC ............ *G06F 13/4027* (2013.01); *G06F 1/08* (2013.01); *G06F 3/0656* (2013.01); *G06F 13/385* (2013.01); *G06F 13/387* (2013.01); *G06F 13/4059* (2013.01); *G06F 13/4282* (2013.01); *G11C 2207/107* (2013.01); *H03M 2201/526* (2013.01)

(58) Field of Classification Search
CPC ............... G06F 13/4059; G06F 3/0656; G06F 13/4018; G06F 13/385; G06F 13/387; G06F 13/4027; G06F 13/4282; G11C 2207/107; H03M 2201/526
USPC .......................................... 710/52, 53, 66, 71
See application file for complete search history.

(56) References Cited

U.S. PATENT DOCUMENTS

| | | | | |
|---|---|---|---|---|
| 6,628,679 | B1* | 9/2003 | Talarek | ............... H04J 3/047 370/536 |
| 7,626,523 | B2 | 12/2009 | Shin et al. | |
| 7,990,293 | B2 | 8/2011 | Luo | |
| 8,902,091 | B1 | 12/2014 | Miller et al. | |
| 2009/0086847 | A1* | 4/2009 | Lei | ................ H03K 5/135 375/295 |
| 2011/0191619 | A1* | 8/2011 | Morrison | ............ G11C 7/1012 713/500 |
| 2014/0355658 | A1 | 12/2014 | Meier et al. | |
| 2014/0362962 | A1 | 12/2014 | Meier et al. | |

OTHER PUBLICATIONS

Sawyer, Nick, "1:7 Deserialization in Spartan-3E/3A FPGAs at Speeds Up to 666 Mbps", XAPP485 (v1.3), Xilinx, Inc., Jun. 9, 2010, 12 pages.

* cited by examiner

*Primary Examiner* — Glenn A Auve
(74) *Attorney, Agent, or Firm* — Sheridan Ross P.C.

(57) ABSTRACT

A Serializer/Deserializer (SerDes) is described with an architecture that simultaneously provides flexibility for many different gear ratios as well as reduced power consumption. The SerDes utilizes latches where flops were previously used to help reduce power consumption, among other things. The SerDes also includes a main register bank with a plurality of sub-banks that can be filled according to any number of different schemes, thereby enabling the SerDes to accommodate different output widths.

20 Claims, 13 Drawing Sheets

US 9,767,062 B2

LOW POWER PARALLELIZATION TO MULTIPLE OUTPUT BUS WIDTHS

FIELD OF THE DISCLOSURE

The present disclosure is generally directed toward data parallelization and, in particular, data parallelization to multiple output bus widths.

BACKGROUND

Serializer/Deserializers (Ser/Des) are devices that can take wide bit-width, single-ended signal buses and compress them to a few, and often times one, differential signal that switches at a much higher frequency rate than the wide single-ended data bus. A SerDes is often used in high-speed communication networks and is typically an Integrated Circuit (IC) transceiver. In other words, the SerDes provides the interface between a core of an IC or similar processor core and the communication channel used to carry information to/from the core of the IC or processor.

Thirty years ago, the operational speed of the IC or processor core usually exceeded the speed with which information could be carried to/from the IC or processor core. However, advances in high-speed communication network technologies have caused the communication channel to operate at much higher speeds (e.g., gigabit or multigigabit speeds) than the IC or processor core. Accordingly, the SerDes is needed to parallelize and slow down the data received on the communication channel before it can be fed to the IC or processor core.

Problematically, most SerDes consume a significant amount of power, even though they represent a small portion of the overall IC or processor. Additionally, most SerDes are specifically designed to output data at a single bus width. It would be advantageous to provide a SerDes solution that consumes less power and is capable of outputting multiple output bus widths.

BRIEF DESCRIPTION OF THE DRAWINGS

The present disclosure is described in conjunction with the appended figures, which are not necessarily drawn to scale.

DETAILED DESCRIPTION

Figure 1:
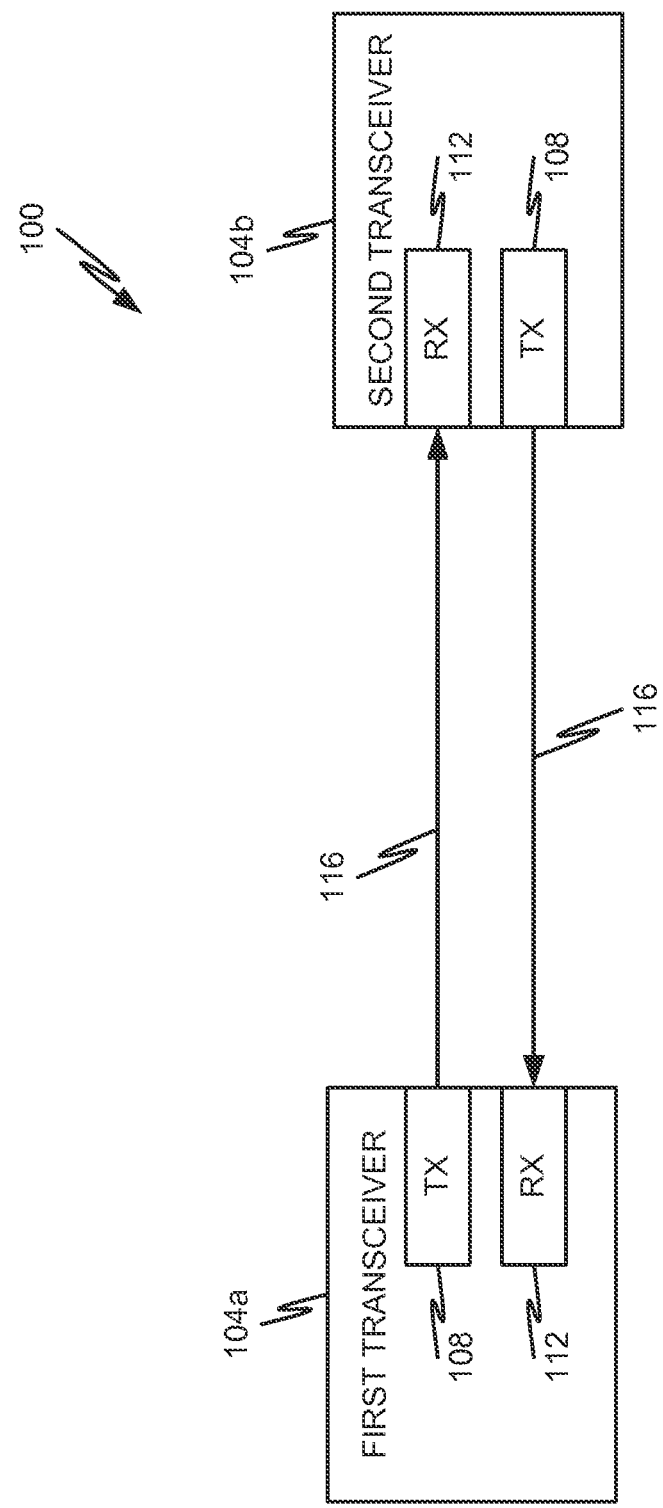
FIG. 1 is a block diagram depicting a communication system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

While embodiments of the present disclosure will be described in connection with a receiver of a serialized data stream that parallelizes the data received therefrom, it should be appreciated that embodiments of the present disclosure are not so limited. In particular, while the particular type of low-level circuit or circuit components described herein (e.g., a Serializer/Deserializer (SerDes)) is capable of decelerating and parallelizing data, it should be appreciated that any type of Integrated Circuit (IC), IC chip, IC chip component, audio/video signal processing, telephone system, etc. can utilize circuitry and/or systems described herein.

Furthermore, embodiments of the present disclosure will describe clock or operating speeds using terms like F2, F4, etc. As used herein, "F" or "F1" refers to a full operational frequency or clock speed used on a communication channel. As an example, a gigabit Ethernet channel may operate at a speed of 28 gigahertz, in which case F or F1 would correspond to 28 gigahertz. As used herein, F2 refers to half of the full frequency, or in the example above, 14 gigahertz. As used herein, F4 refers to a quarter of the full frequency, or in the example above, 7 gigahertz. It should be appreciated that embodiments of the present disclosure are not limited to F corresponding to 28 gigahertz; rather, any clock speed can be accommodated. Embodiments of the present disclosure can be implemented in architectures where F ranges anywhere from 10 MHz to 100 GHz or more.

As will be discussed herein, embodiments of the present disclosure utilize the best of two previous architectures while eliminating or, at least, reducing the worst. In some embodiments, upstream circuitry is used to dictate an F2 clock input and two data steams. The first stage is used to quickly convert those inputs into a F4-based circuit with four data streams. This reduces power consumption as well as design complexity. Additional power is saved by converting as many flops as possible into latches. Thereafter, a round-robin "fill" circuit is utilized to allow the output to accommodate four different output widths: 16, 20, 32, and 40 bits. A further modification adds a 10-bit output mode which allows for legacy support. With five output modes, the circuits of the present disclosure can be used in all currently known designs. This drastically reduces design effort and schedule risk.

In accordance with at least some embodiments, a circuit is disclosed that uses an F2 clock, but the "fast" bank is only 2× the size of the input data streams, so groups of four data bits are created. Simultaneously, the design generates an F4 clock. In some embodiments, the group of four data bits is written into five banks of four flops at F4 speed. The fill mechanism is controlled by a one-hot bank of five flops. When the five banks are filled, the machine outputs 20 bits of data (assuming a 20-bit mode is active). In some embodiments, if a bit mode of 40 bits is being utilized, then the bits above 20 bits are written into a shadow register bank of 20 flops. They wait in the shadow register bank until the banks of the main register are filled again. As an example, if a 40-bit mode is being used, then the shadow register bank and the latest 20 bits in the main register bank are released as a 40 bit output bus to a processor core.

In some embodiments, the 16-bit mode and 32-bit mode can act similarly. The last bit of the one-hot bank doesn't go high, so only 16 bits of data are written into the five banks of flops. Those 16 bits can be outputted in 16-bit mode, or for 32-bit mode, the first 16 bits are written into the shadow register bank, and when the next group of 16 bits arrives in the main register, 32 bits are output to the processor core.

In some embodiments, the 10-bit mode still uses the five banks of four flops and the one-hot bank acts as the fill mechanism. However, after 12 bits are written into the five banks, the first 10 bits are output. After the next 8 bits are written into the five banks, the second 10 bits are output. Generating a symmetric timing delay between the data release events relies on careful clock manipulation and a pulse kill circuit to avoid glitches.

It should be appreciated that the designs depicted and described herein can be duplicated on silicon to handle multi-bit standards (e.g., PAM4) in addition to NRZ.

Referring now to FIG. 1, a communication system 100 will be described in accordance with at least some embodiments of the present disclosure. The system 100 is shown to include one or more transceivers 104a, 104b, each having a transmitter 108 and a receiver 112. The transceivers 104a, 104b are shown to communicate with one another via one or more communication channels 116 that connect a transmitter 108 with a receiver 112. It should be appreciated that embodiments of the present disclosure may also be implemented in a communication system having dedicated transmitters 108 and receivers 112 instead of a combination of a transmitter 108 and receiver 112 being implemented in a transceiver 104.

In some embodiments, the communication channel 116 may carry an analog signal that is modulated according to any type of known modulation technique, such as Amplitude Modulation, Pulse Amplitude Modulation, Non-Return to Zero Modulation, Double-Sideband Modulation, Vestigal Sideband Modulation, Quadrature Amplitude Modulation, Frequency Modulation, Phase Modulation, combinations thereof, or the like. The communication channel 116 may include a wired communication medium (e.g., a physical wire, coaxial cable, fiber-optics, etc.), a wireless communication medium (e.g., air), or a combination of wired and wireless media. It should be appreciated that the transmitter 108 may be configured to first receive a digital signal as an input (e.g., from a digital circuit or digital circuit components, such as an IC or IC component) and then convert the digital signal into an analog signal for transmission across the communication channel 116. The receiver 112 may be configured to receive the analog signal from the communication channel 116 and convert the analog signal back into a digital signal for processing by a digital circuit or processor core that is connected to an output of the receiver 108. It should be appreciated that the communication channel 116 may traverse long or short distances. For instance, the communication channel 116 may correspond to a short interconnection between components on an IC chip. In some embodiments, the communication channel 116 may correspond to a SerDes channel. As another example, the communication channel 116 may correspond to a long interconnection (e.g., on the order of miles) between a transmitting station and a receiving station.

Figure 2:
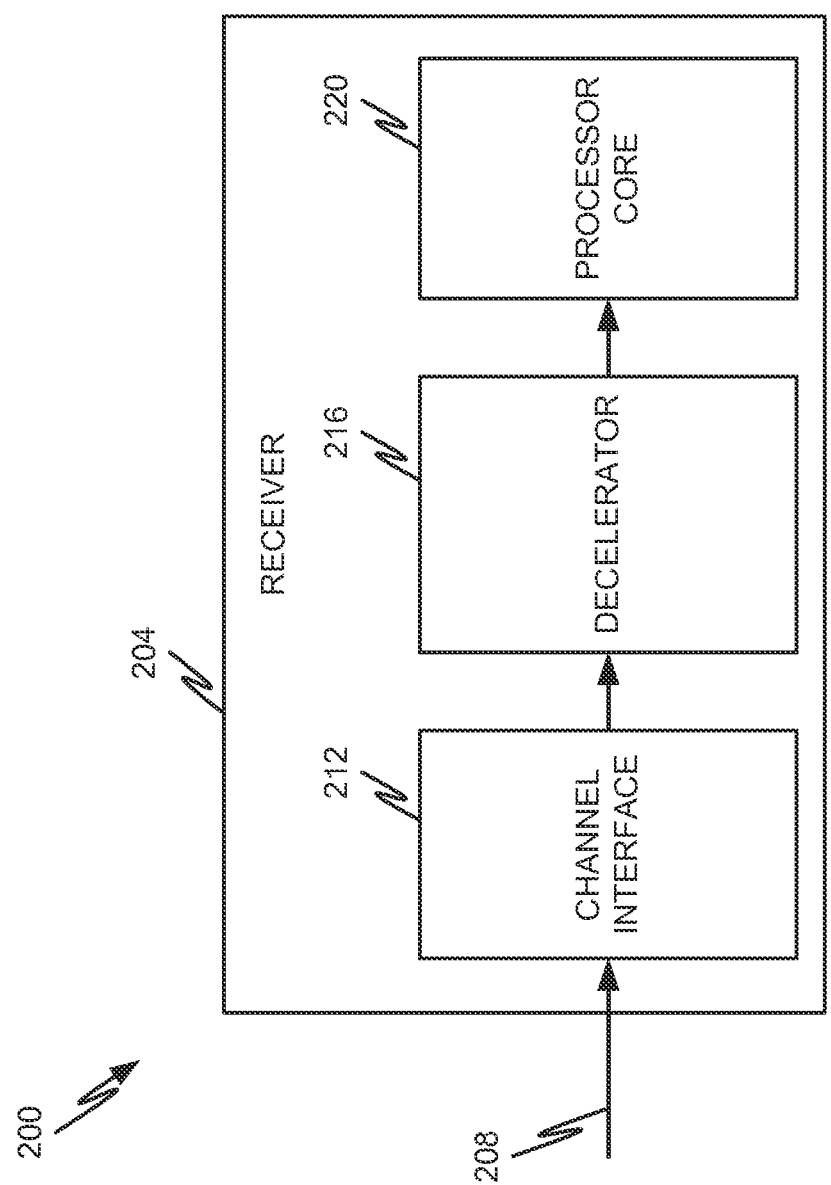
FIG. 2 is a block diagram depicting details of a receiver in accordance with embodiments of the present disclosure.

Referring now to FIG. 2, additional details of a receiver system 200 will be described in accordance with at least some embodiments of the present disclosure. The receiver system 200 may correspond or be similar to receiver 112. In some embodiments, the receiver system 200 includes a receiver 204, which in some embodiments may correspond to an IC chip, a PCB having a number of IC chips and other electrical components mounted thereto, etc. The receiver 204 is shown to include a channel interface 212, a decelerator 216, and a processor core 220. Although components 212, 216, 220 are shown as being a part of a common receiver 204, it should be appreciated that the components 212, 216, 220 can be included in different physical components. For instance, the channel interface 212 may correspond to a physical interface with the communication channel 116 whereas the decelerator 216 and processor core 220 may correspond to digital circuits embodied on a common IC chip or in a common silicon wafer. In other embodiments, all of the components 212, 216, 220 may be incorporated into a common device, such as a common IC chip or the like.

The channel interface 212 may correspond to the component of the receiver 204 that physically receives a serialized signal 208. The serialized signal 208 may be transmitted over the communication channel 116 and then received at the channel interface 212. The channel interface 212 may provide the serialized signal 208 or components thereof to a decelerator 216 for deceleration and parallelization of the serialized signal 208. In some embodiments, the channel interface 212 may separate the different portions of the serialized signal 208 and provide each individual portion thereof (e.g., a first data stream and a second data stream) to different portions of the decelerator 216.

The decelerator 216 processes the inputs received from the channel interface 212 for outputting to the processor core 220. In some embodiments, the decelerator 216 is utilized to slow down the data from the communication channel 116 to a clock speed of the processor core 220 (e.g., a speed at which a clock or clocks of the processor core 220 operate on data). Thus, the decelerator 216 may provide parallelized data to the processor core. As will be discussed in further detail herein, the decelerator 216 may be modified to output data in a number of different output modes. In some embodiments, the decelerator 216 may accommodate output widths of 10-bits, 16-bits, 20-bits, 32-bits, or 40-bits. The different output widths can be accommodated by simply modifying the manner with which data is pulled from a main register bank and, optionally, a shadow register bank. Often times, the processor core 220 operating speed or clock speed is known, therefore, the gear ratio for the decelerator 216 is easily determined and the appropriate output width can be selected on a per-receiver basis 204.

Once the processor core 220 receives the data from the decelerator 216, the processor core 220 is free to manipulate and process the data as necessary. The data provided to the processor core 220 is usually in the form of digital data sufficient to be processed by digital circuit components and logic.

Figure 3:
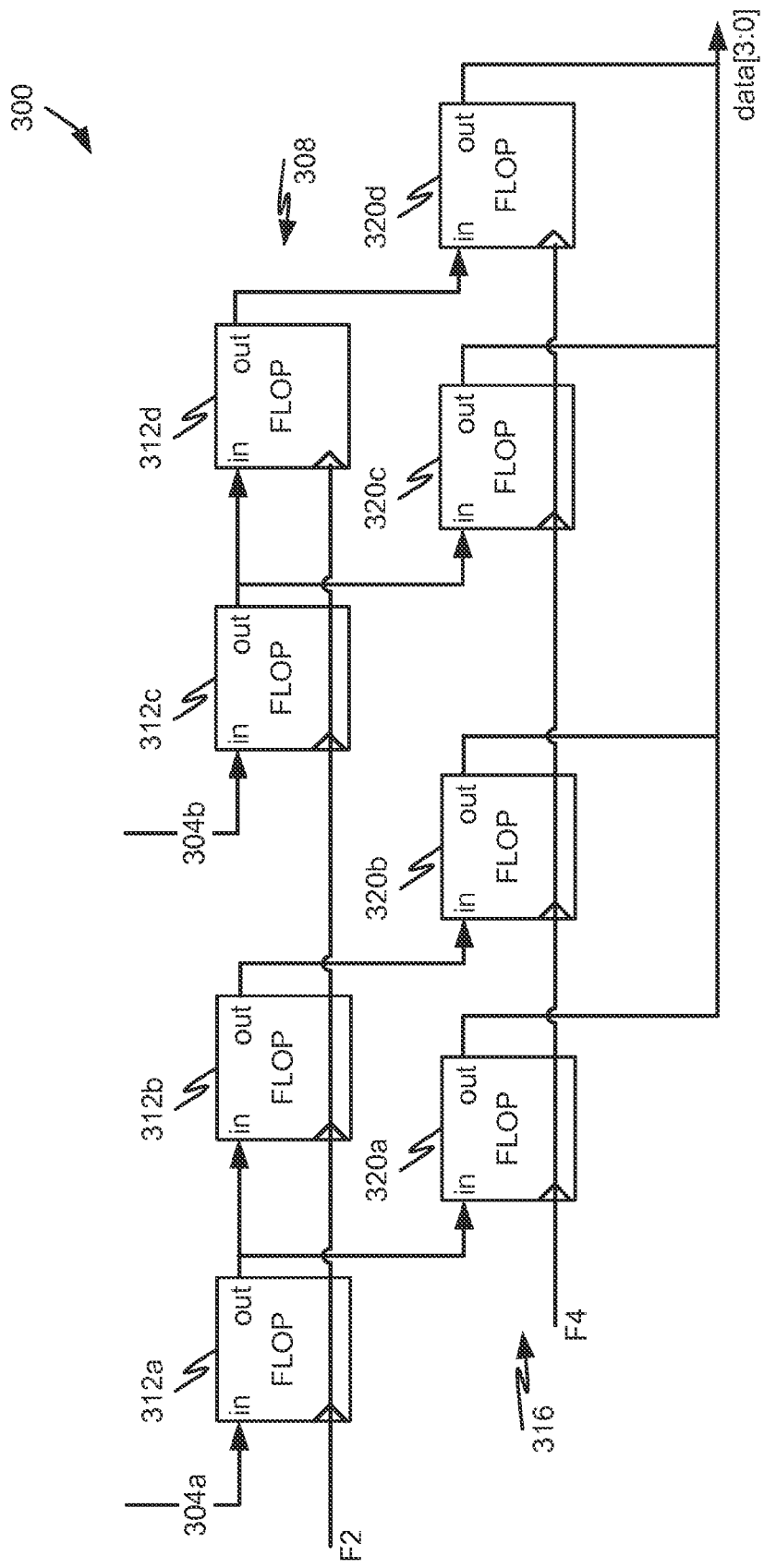
FIG. 3 is a block diagram depicting details of a first circuit for decelerating data received on a communication bus in accordance with embodiments of the present disclosure.

With reference now to FIG. 3, additional details of a first circuit 300 that may be included as part of the decelerator 216 will be described in accordance with at least some embodiments of the present disclosure. The first circuit 300 is shown to receive a first data stream 304a and a second data stream 304b, which may correspond to components of a serialized signal 208 received by the receiver 204. The first data stream 304a and second data stream 304b may have been modulated on the serialized signal 208 using any form of modulation method described herein.

The first data stream 304a and second data stream 304b are both provided to a first bank of circuit elements 308. The first bank of circuit elements 308 is shown to include a first circuit element 312a, a second circuit element 312b, a third circuit element 312c, and a fourth circuit element 312d. It should be appreciated, however, that a larger number of circuit elements may be included in the first bank of circuit elements 308 without departing from the scope of the present disclosure.

In the depicted embodiment, the circuit elements 312a-d correspond to flops operating at a clock frequency of F2; that is, a clock frequency that is half the clock speed used to transmit the serialized data stream 208. It should be appreciated that any clock frequency slower than the clock speed used to transmit the serialized data stream 208 can be used to operate the circuit elements 312a-d. The first bank of circuit elements 308 is used to serially step the first data stream 304a and second data stream 304b at clock frequency F2.

Data from the first bank of circuit elements 308 is subsequently provided to a second bank of circuit elements 316. The second bank of circuit elements 316 is also shown to include four circuit elements 320a-d, which can also correspond to flops. Again, a greater number of circuit elements 320 can be included in the second bank of circuit elements 316 without departing from the scope of the present disclosure. The circuit elements 320a-d are shown to operate at a reduced frequency, F4 in this example, which is half the operating frequency used for the first bank of circuit elements 308. Thus, the second bank of circuit elements 320a-d decelerate the data received from the first and second streams 304a, 304b. The output of the circuit elements 320a-d corresponds to a parallel load of four bits of data. Thus, the circuit 300 has basically converted a two-bit input from the first and second data streams 304a, 304b into a four-bit output. One advantage to decelerating the data streams 304a, 304b as quickly as possible is to reduce the amount of power consumed by the circuits of the decelerator 216 and the receiver 204 as a whole. Another advantage to reducing the clock speed as quickly as possible is that Field Effect Transistors (FETs) and other digital circuit components consume more energy when operating at higher clock speeds and it becomes possible to fully saturate a signal at slower clock speeds.

Figure 4A:
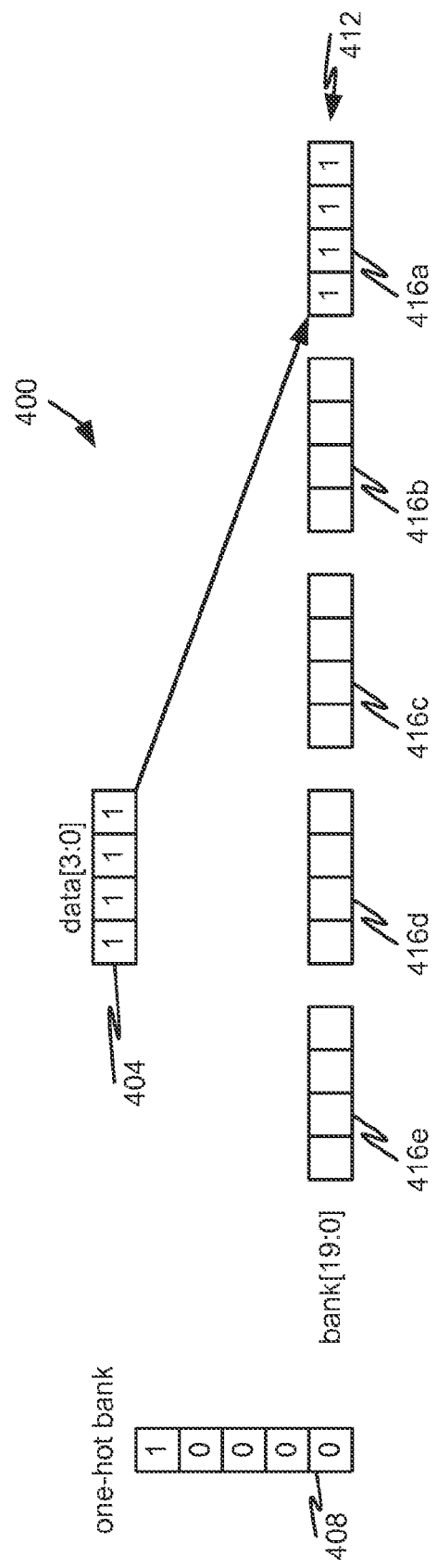
FIG. 4A is a block diagram depicting a first state of a second circuit for parallelizing data for transmission to a processor core in accordance with embodiments of the present disclosure.
Figure 4B:
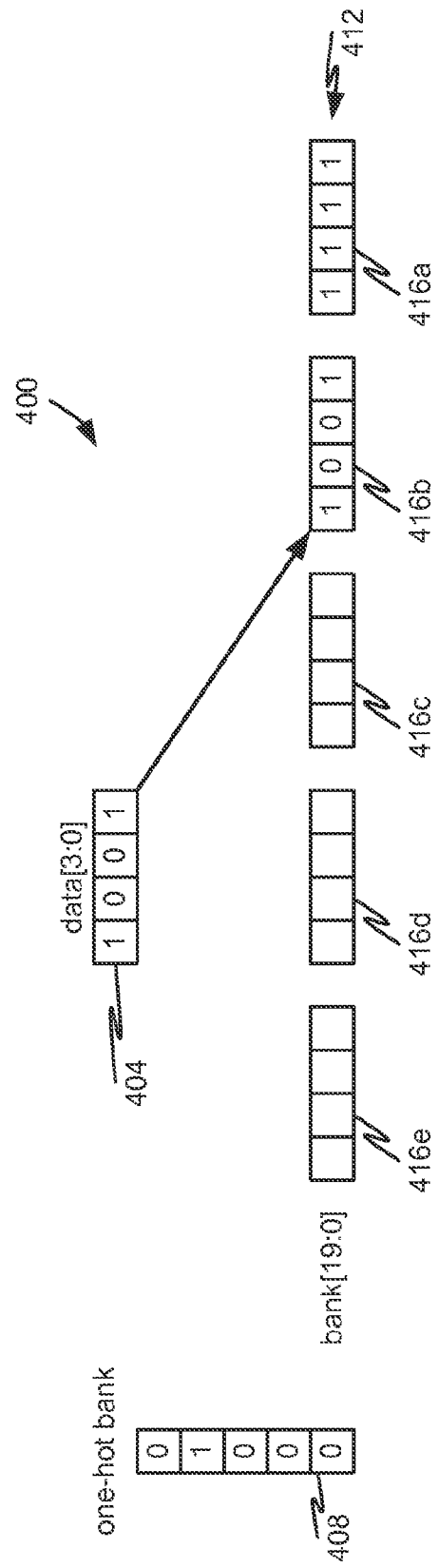
FIG. 4B is a block diagram depicting a second state of the second circuit for parallelizing data for transmission to a processor core in accordance with embodiments of the present disclosure.
Figure 4C:
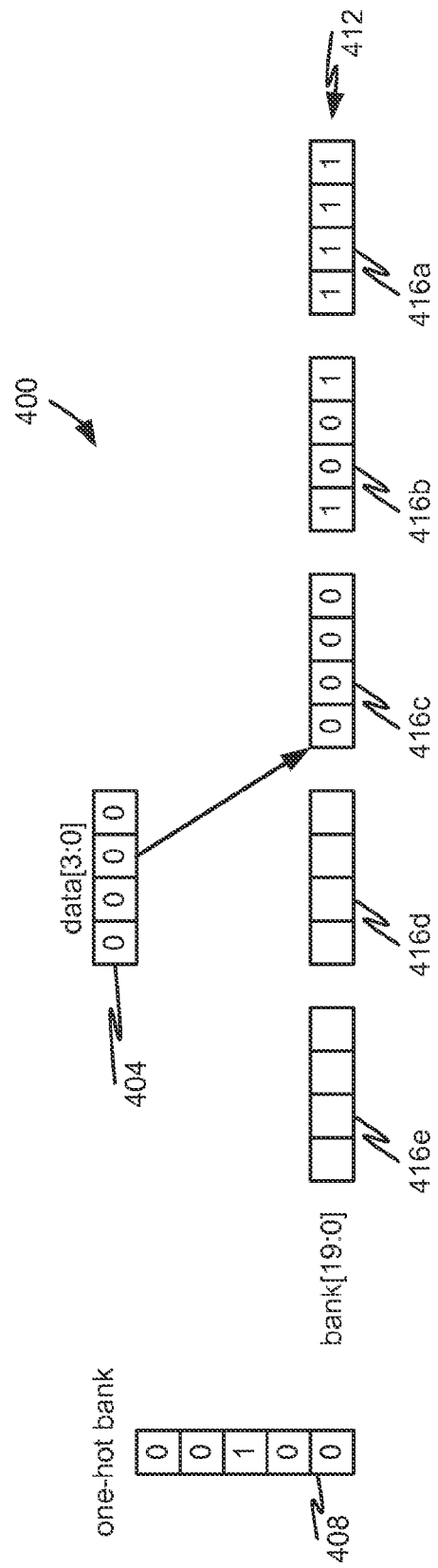
FIG. 4C is a block diagram depicting a third state of the second circuit for parallelizing data for transmission to a processor core in accordance with embodiments of the present disclosure.
Figure 4D:
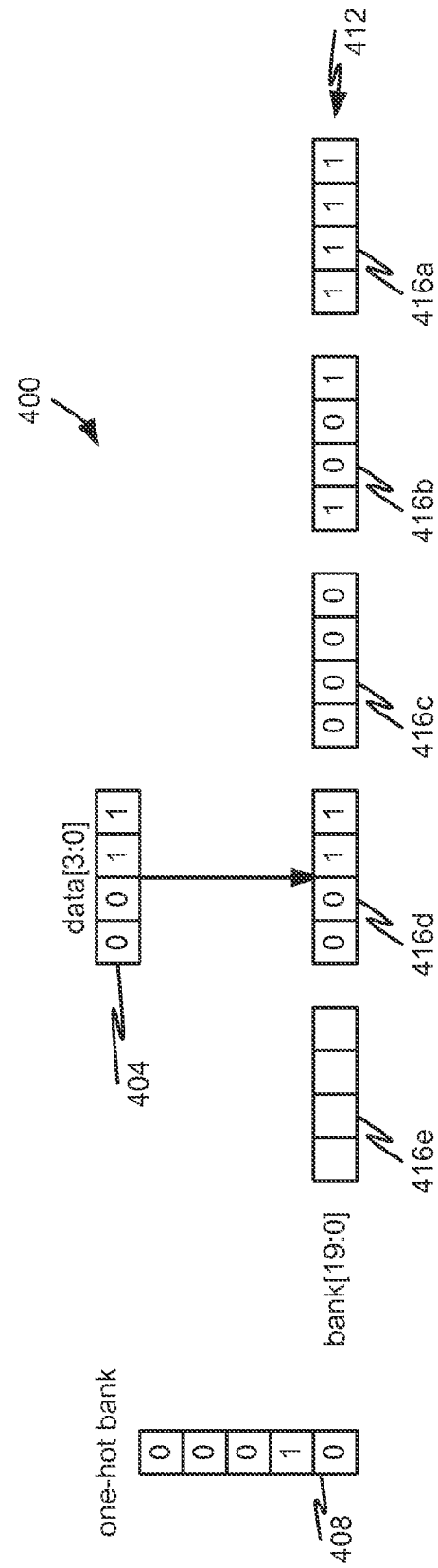
FIG. 4D is a block diagram depicting a fourth state of the second circuit for parallelizing data for transmission to a processor core in accordance with embodiments of the present disclosure.
Figure 4E:
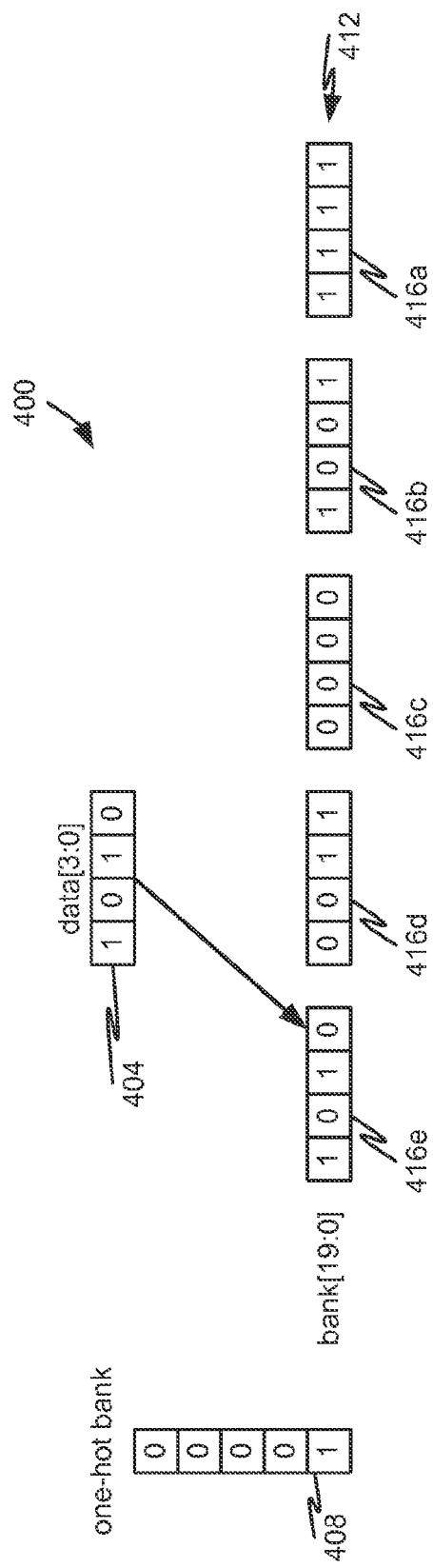
FIG. 4E is a block diagram depicting a fifth state of the second circuit for parallelizing data for transmission to a processor core in accordance with embodiments of the present disclosure.
Figure 4F:
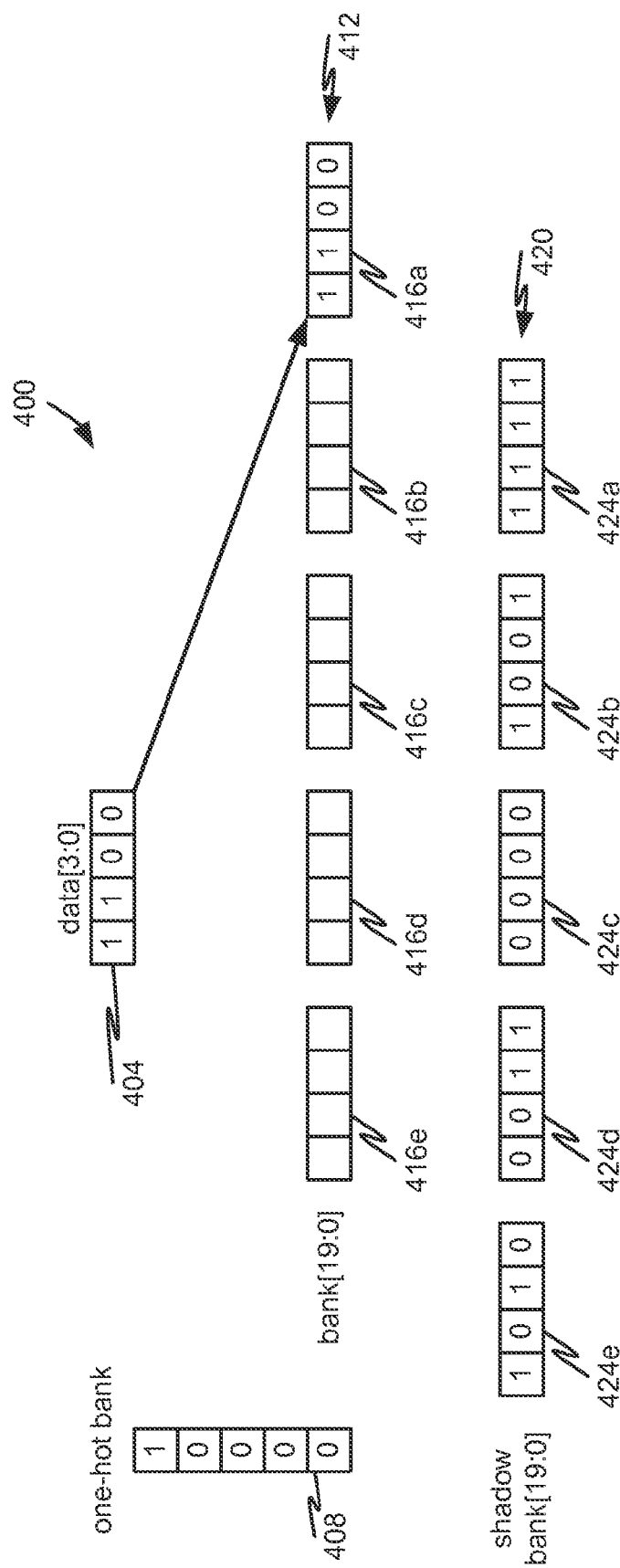
FIG. 4F is a block diagram depicting a first option for feeding data from the second circuit to a processor core in accordance with embodiments of the present disclosure.
Figure 4G:
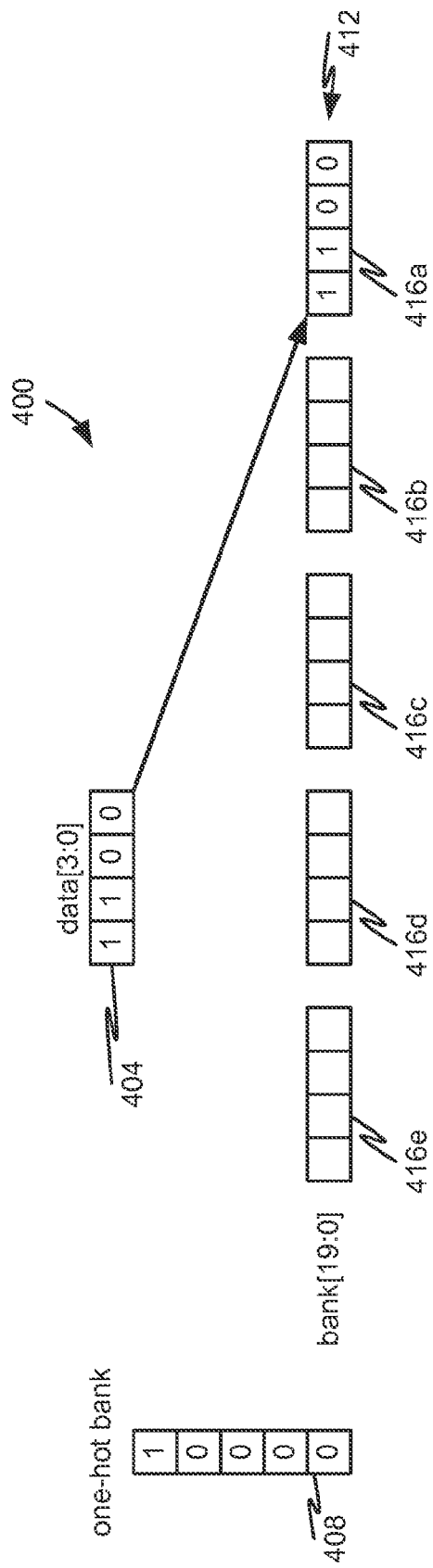
FIG. 4G is a block diagram depicting a second option for feeding data from the second circuit to a processor core in accordance with embodiments of the present disclosure.
Figure 4H:
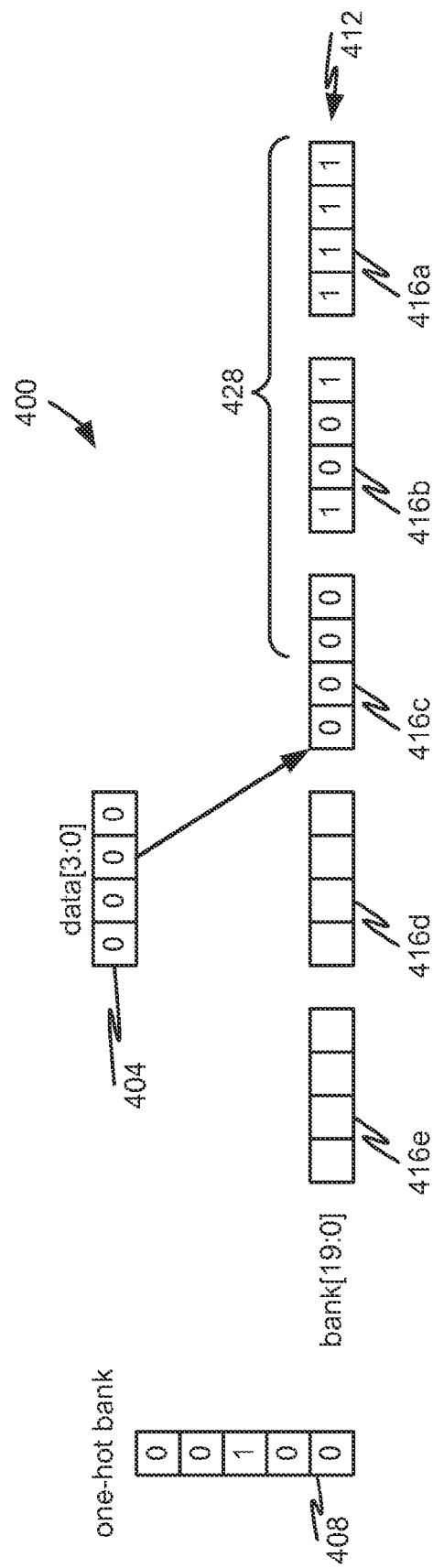
FIG. 4H is a block diagram depicting a first option for feeding data from the second circuit to a processor core in accordance with embodiments of the present disclosure.
Figure 5:
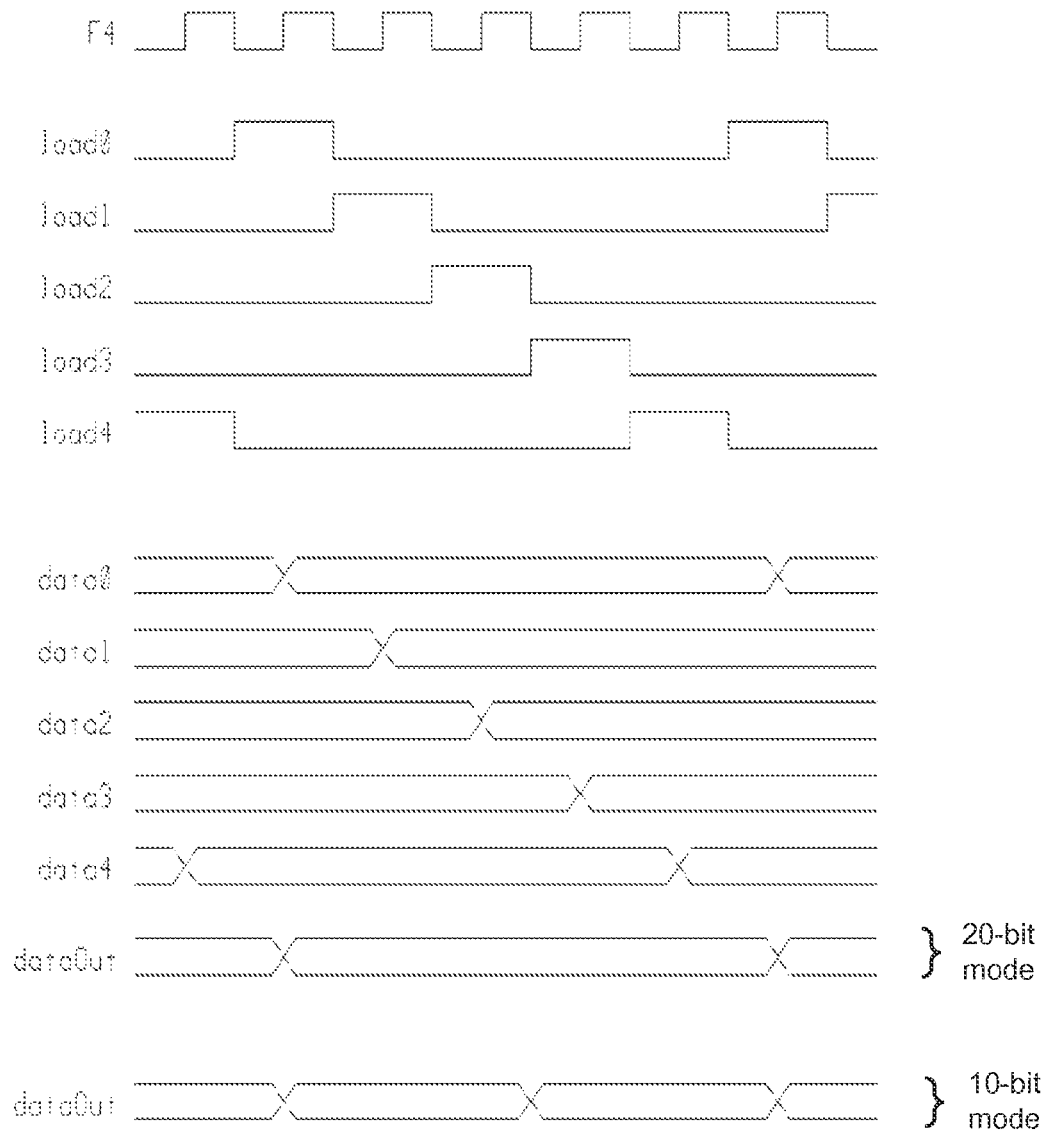
FIG. 5 is a timing diagram depicting methods for operating a SerDes in accordance with embodiments of the present disclosure.

With reference now to FIGS. 4A-5, circuits and methods for handling the four bit output of the circuit 300 will be described in accordance with at least some embodiments of the present disclosure. Referring initially to FIGS. 4A-4H, the four-bit output of circuit 300 is shown as an input to a second circuit 400. The second circuit 400 may also correspond to a component or module of the decelerator 216. Although depicted separately, it should be appreciated that the first circuit 300 and second circuit 400 may be embodied as a single circuit without departing from the scope of the present disclosure.

As shown in FIG. 4A, the second circuit 400 may receive as an input the four bits of data 404 output by the first circuit 300. The second circuit 400 may also include a main register bank 412 comprising a plurality of sub-banks 416a-e, each sized to receive a full load of data from the second bank of circuit elements 316 (e.g., four bits). The second circuit 400 may further include a one-hot bank 408 that controls which of the sub-banks 416a-e receives the four bits of data 404. Illustratively, the one-hot bank 408 may comprise a separate bit field that corresponds to each of the sub-banks 416a-e in the main register bank 412. Only one bit in the one-hot bank 408 is high or valued at "1" at any given time. Alternatively, a low or "0" value may be used to indicate which sub-bank 416a-e is to receive the four bits of data 404. Depending upon which bit field is high or valued at "1", the corresponding sub-bank 416a-e has the four bits of data 404 written thereto.

Although FIGS. 4A-H show the main register bank 412 as comprising five sub-banks 416a-e, each with an equal number of bit fields, it should be appreciated that a greater or lesser number of sub-banks may be included in the main register bank 412. Furthermore, it should be appreciated that the sub-banks 416a-e may have more or less bit fields than are being received from the output of the first circuit 300. In some embodiments, the bit fields of the sub-banks 416a-e are implemented as latches that can hold a bit value until an appropriate number of other sub-banks have been filled, at which point the information from the latches can be output to the processor core 220. It should be appreciated that circuit components other than latches can alternatively be used to store the bit values of the sub-banks 416a-e without departing from the scope of the present disclosure.

To illustrate the manner in which the sub-banks 416a-e can have data written thereto from the four bits of data 404 received from the first circuit 300, FIG. 4A shows how in a first step (e.g., for a generation of a first set of four bits of data 404), the first sub-bank 416a has its four bit fields filled with the four bits of data 404. During this step, the corresponding first bit field in the one-hot bank 408 is set to a different value than the other bit fields (e.g., "1" as compared to the other values being set to "0").

The first circuit 300, then produces a new set of four bits of data 404 as shown in FIG. 4B. This new set of four bits of data 404 is written to the second sub-bank 416b. This occurs because the second bit field in the one-hot bank 408 is set to the value of "1" whereas the other bit fields in the one-hot bank 408 are set to the value of "0".

Thereafter, the first circuit 300 produces yet another new set of four bits of data 404 as shown in FIG. 4C. This new set of four bits of data 404 is written to the third sub-bank 416c. This occurs because the third bit field in the one-hot bank 408 is set to the value of "1" whereas the other bit fields in the one-hot bank 408 are set to the value of "0".

Thereafter, the first circuit 300 produces still another new set of four bits of data 404 as shown in FIG. 4D. This new set of four bits of data 404 is written to the fourth sub-bank 416d. This occurs because the fourth bit field in the one-hot bank 408 is set to the value of "1" whereas the other bit fields in the one-hot bank 408 are set to the value of "0".

Thereafter, the first circuit 300 produces yet another new set of four bits of data 404 as shown in FIG. 4E. This new set of four bits of data 404 is written to the fifth sub-bank 416e. This occurs because the fifth bit field in the one-hot bank 408 is set to the value of "1" whereas the other bits fields in the one-hot bank 408 are set to the value of "0".

As mentioned above, the second circuit 400 can be adjusted to accommodate different output data widths. In some embodiments, if a 20-bit output is desired from the second circuit 400, then the full 20 bits of data in the main register bank 412 are output to the processor core 220 when the main register bank 412 is filled. Thereafter, the fill process can start again at the first sub-bank 416a as discussed in connection with FIG. 4A. The starting over of the process may simply re-write the new data over the old data in the sub-banks. Alternatively, the bit values stored in the bit fields of the sub-banks may be erased prior to being re-written with new data. If some output other than a 20-bit output is desired, then the second circuit 400 can be configured to operate in a different manner.

One example of an alternative output process for the second circuit 400 is shown in FIG. 4F, which depicts a shadow register bank 420 used in addition to the main register bank 412. The shadow register bank 420 may utilize sub-banks 424a-e having latches or a similar technology to store bit values previously stored in the sub-banks 416a-e of the main register bank 412. The shadow register bank 420 can help the second circuit 400 operate in either a 32-bit mode or a 40-bit mode. If operating in a 40-bit mode, then the main register bank 412 will be completely refilled with new data while the shadow register bank 420 and its corresponding sub-banks 424a-e hold the data previously stored in the main register bank 412. After the main register bank 412 is re-filled, then the second circuit 400 outputs the entirety of the main register bank 412 and the entirety of the shadow register bank 420, which is a 40-bit output.

If either a 16-bit output or a 32-bit output is desired, then there may only be a need to use the first four sub-banks 416a-d and not use the fifth sub-bank 416e. In particular, if a 16-bit output is desired, then the first four sub-banks 416a-d are solely used. If a 32-bit output is desired, then the first sub-bank 416a, second sub-bank 416b, third sub-bank 416c, and fourth sub-bank 416d are filled a first time, then copied to first, second, third, and fourth sub-banks 424a-d of the shadow register 420. Once the shadow sub-banks 424a-d have been filled, the sub-banks of the main register bank 420 are filled a second time. Thereafter, the data from the first, second, third, and fourth shadow sub-banks 424a-d and the first, second, third, and fourth sub-banks 416a-d are output to the processor core 220 as a 32-bit output.

As shown in FIG. 4G, after all of the data is output from main register bank 412 and optionally the shadow register bank 420, the new set of four bits 404 generated by the first circuit 300 can be written to the first sub-bank 416a of the main register bank 412. The step shown in FIG. 4G may be similar or identical to the step shown in FIG. 4A, except that it occurs at a later time.

FIG. 4H shows yet another alternative for outputting data from the second circuit 400. As mentioned above, output data widths of 20-bits, 16-bits, and 10-bits can also be accommodated by the second circuit 400. To accommodate output data widths of less than 20-bits, the second circuit 400 can be operated in such a manner that data from less than all of the sub-banks 416a-e in the main register bank 412 are output prior to completely filling the sub-banks 416a-e. For instance, as shown in FIG. 4H, a selected output 428 can be taken from the first sub-bank 416a, second sub-bank 416b, and third sub-bank 416c. Thus, after twelve bits have been written to the main register bank 412, the first ten bits can be included in the selected output 428. The filling of the main register bank 416 would continue by filling the fourth and fifth sub-banks 416d, 416e at which point the selected output 428 could be taken from the other two bits of the third sub-bank 416c as well as the entirety of the fourth and fifth sub-banks 416d, 416e.

FIG. 5 shows additional timing details related to the operation of the first circuit 300 and second circuit 400. In particular, FIG. 5 depicts the clock speed used to operate the second bank of circuit elements 316 (F4 in this example). This clock speed corresponds to the clock speed for the output data bits 404 being provided to the second circuit 400. The various load values (load0, load1, load2, load3, and load4) correspond to the bit values used to operate the one-hot bank 408. The data outputs (data0, data1, data2, data3, and data4 correspond to the timing with which data 404 is written to the appropriate registers or sub-banks 416a-e of the main register bank 412, depending upon the current value of the bits in the one-hot bank 408. Again, the second circuit 400 can be configured to operate in any one of a 10-bit mode, 16-bit mode, 20-bit mode, 32-bit mode, and 40-bit mode.

Figure 6:
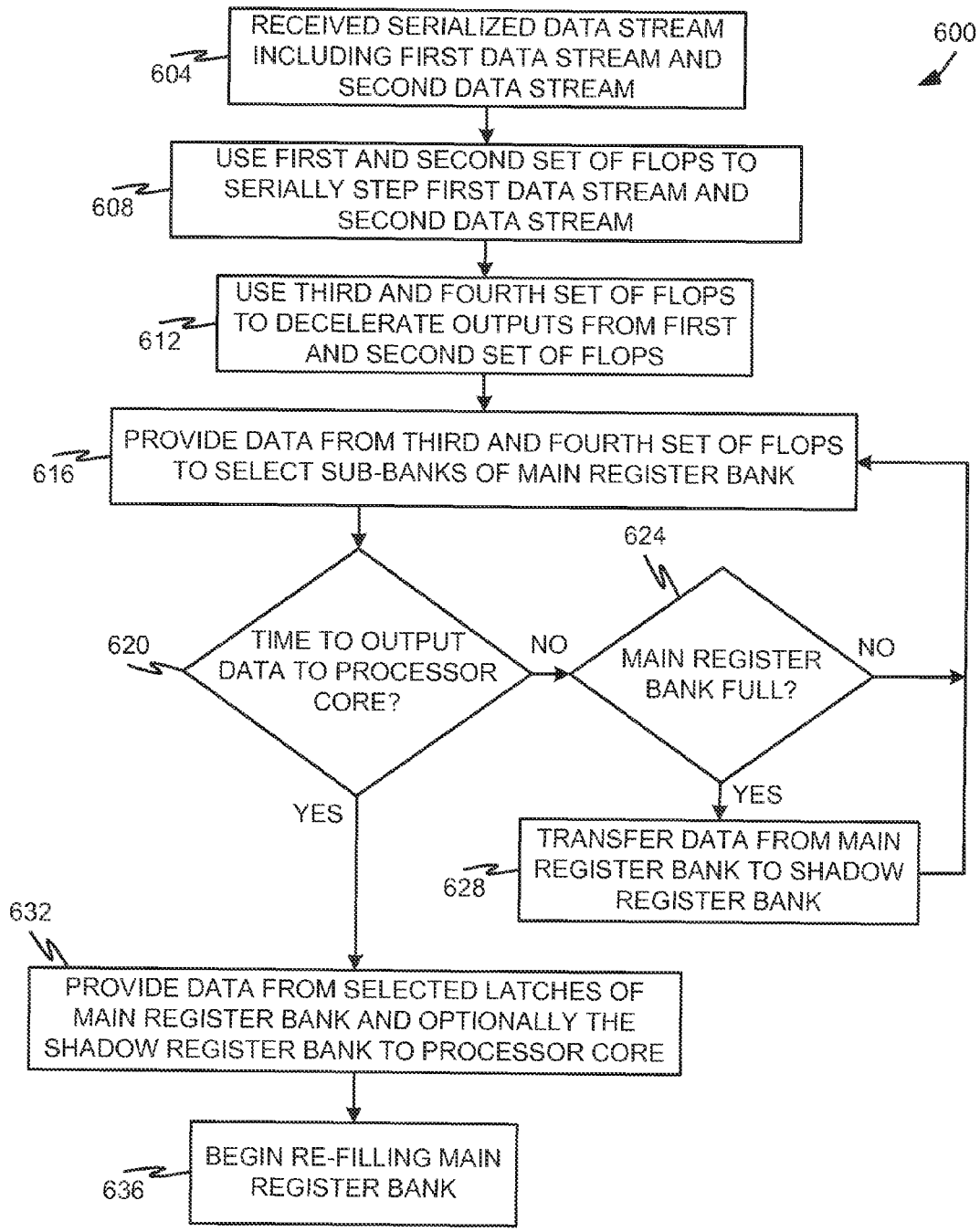
FIG. 6 is a flow diagram depicting a method of parallelizing data received on a communication channel for transmission to a processor core in accordance with embodiments of the present disclosure.

With reference now to FIG. 6, a method 600 of parallelizing data received on a communication channel 116 for transmission to a processor core 220 will be described in accordance with embodiments of the present disclosure. The method 600 begins when serialized data is received that includes a first data stream 304a and a second data stream 304b (step 604). It should be appreciated that the serialized data stream may include more than two data streams, but only two data streams are described for simplicity of understanding.

The method 600 continues by using a first and second set of flops to serially step the first data stream 304a and second data stream 304b (step 608). Thereafter, a third and fourth set of flops are used to decelerate the outputs of the first and second set of flops (step 612). As an example, the data streams may be decelerated from 28 gigahertz to 14 gigahertz.

The now decelerated data is provided to a selected sub-bank 416a-e in the main register bank 412 (step 616). The sub-bank to which the data is provided will depend upon the current state of the one-hot bank 408.

The method 600 continues by determining if it is time to output some data from the main register bank 412 and optionally a shadow register bank 420 to the processor core 220 (step 620). If this query is answered negatively, then the method proceeds by determining if the main register bank 412 is full (step 624). If this query is answered negatively, then the method 600 returns back to step 616 and new data produced by the first circuit 300 is output to a new sub-bank in the main register bank 412.

If the query of step 624 is answered affirmatively, then the data from the main register bank 412 is transferred to the shadow register bank 420 (step 628). Thereafter, the method 600 returns back to step 616 to begin the process of re-filling the main register bank 412.

Referring back step 620, if it is determined that it is time to output data from the second circuit 400 to the processor core 220, then the method 600 continues by providing data from selected latches of the main register bank 412 and optionally the shadow register bank 420 to the processor core 220 (step 632). Thereafter, the main register bank 412 either begins the process of re-filling or being completely filled (e.g., if using 10-bit mode) (step 636).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit configured to receive data from a serialized data stream that includes a first data stream and a second data stream and then condition the received data for transmission to a processor core operating at a clock speed that is less than a clock speed used to transmit the serialized data stream, the circuit comprising:
   a first bank of circuit elements configured to receive the data from the first data stream and the second data stream;
   a second bank of circuit elements configured to receive the data from the first bank of circuit elements and decelerate the data received from the first bank of circuit elements to a reduced frequency that is a quarter the clock speed used to transmit the serialized data stream; and
   a main register bank comprising a plurality of sub-banks each sized to receive a full load of data from the second bank of circuit elements, wherein a first sub-bank in the plurality of sub-banks receives a first set of data from the second bank of circuit elements at a first time, wherein a second sub-bank in the plurality of sub-banks receives a second set of data from the second bank of circuit elements at a second time that follows the first time, and wherein each of the plurality of sub-banks provide data stored therein to the processor core substantially simultaneously.

2. The circuit of claim 1, wherein the first time and second time are separated by at least an inverse of the reduced frequency.

3. The circuit of claim 2, wherein the main register bank comprises a third, fourth, and fifth sub-bank, wherein each sub-bank in the plurality of sub-banks comprises at least four latches that incrementally store data received from the second bank.

4. The circuit of claim 3, further comprising a one-hot bank of five flops that controls whether data from the second bank is provided to the first, second, third, fourth, or fifth sub-bank in the plurality of sub-banks.

5. The circuit of claim 4, wherein the latches of the sub-banks hold a bit value until each of the plurality of sub-banks has been filled after which time each of the plurality of sub-banks outputs the stored values to the processor core.

6. The circuit of claim 4, further comprising a shadow register bank configured to receive data from the main register bank and temporarily store the data received from the main register bank until each of the plurality of sub-banks has re-filled at which point the shadow register bank and the main register bank output the stored values to the processor core.

7. The circuit of claim 6, wherein the data provided to the processor core from the main register bank is provided with an output width of either 32-bits or 40-bits.

8. The circuit of claim 4, wherein the data provided to the processor core from the main register bank is provided with an output width of either 10-bits, 16-bits, or 20-bits.

9. The circuit of claim 1, wherein the first bank of circuit elements comprises four flops clocked by a first reduced frequency, wherein the second bank of circuit elements comprises four flops clocked by a second reduced frequency, and wherein the main register bank comprises five sets of four latches that sequentially have data written thereto by the second bank of circuit elements until all five sets of four latches have been filled at which point at least some of the plurality of sub-banks provide the data stored therein to the processor core.

10. The circuit of claim 1, wherein the clock speed used to transmit the serialized data stream comprises at least 1 GHz.

11. A Serializer/Deserializer (SerDes) receiver, comprising:
    a first bank of flops configured to receive a serialized data input from a transmission line, wherein the first bank of flops operates at a first frequency that is approximately one half a frequency of operation of the transmission line;
    a second bank of flops configured to receive data from the first bank of flops, wherein the second bank of flops operates at a second frequency that is approximately one half the first frequency; and
    a main register bank comprising a plurality of sub-banks each having at least four latches therein, wherein each sub-bank in the plurality of sub-banks is configured to sequentially receive data from the second bank of flops and then simultaneously output the data stored therein to a processor core after at least three of the plurality of sub-banks have been filled with data from the second bank of flops.

12. The SerDes receiver of claim 11, wherein the main register bank comprises at least twenty latches divided equally among at least five sub-banks and wherein the serialized data input comprises a first data input stream and a second data input stream.

13. The SerDes receiver of claim 12, wherein data from the second bank of flops is written to the main register bank four bits at a time.

14. The SerDes receiver of claim 12, further comprising a shadow register bank comprising a configuration that substantially matches the main register bank configuration, wherein the shadow register bank stores information from the main register bank until the main register bank fills with additional data received after the shadow register bank received data from the main register bank at which point both the main register bank and shadow register bank output data stored therein to the processor core.

15. The SerDes receiver of claim 14, wherein the shadow register bank and main register bank enable the SerDes receiver to output at least one of a 32-bit output and a 40-bit output to the processor core.

16. The SerDes receiver of claim 11, wherein data written from the second bank of flops to the sub-banks is controlled by a one-hot bank of at least three flops.

17. A method of processing a serialized signal, comprising:
   receiving, from a transmission line operating at a first frequency, a serialized data stream comprising a first data stream and a second data stream, wherein the first data stream is received at a first set of flops and the second data stream is received at a second set of flops, wherein the first and second set of flops operate at a second frequency that is approximately one half the first frequency;
   providing data from the first and second set of flops to a third and fourth set of flops, respectively, wherein the third and fourth set of flops operate at a third frequency that is approximately one half the second frequency; and
   providing data from the third and fourth set of flops to sub-banks of a main register bank where the data is stored until additional sub-banks of the main register bank are filled with data from the third and fourth set of flops at which point the sub-banks of the main register bank are output to a processor core.

18. The method of claim 17, further comprising:
   using a one-hot bank of three or more flops to control a sequence with which the third and fourth set of flops provide data to sub-banks of the main register bank.

19. The method of claim 18, further comprising:
   waiting until at least three sub-banks of the main register bank are filled with data from the third and fourth set of flops and, thereafter, providing data from the main register bank to a shadow register bank;
   after the data from the main register bank has been provided to the shadow register bank, re-filling the at least three sub-banks of the main register bank with additional data from the third and fourth set of flops; and
   after the at least three sub-banks of the main register bank have been re-filled, outputting the data from the shadow register bank and the main register bank to the processor core.

20. The method of claim 19, wherein the main register bank and the shadow register bank each comprise at least sixteen latches equally divided among at least four sub-banks.

* * * * *